United States Patent

Zhu et al.

[11] Patent Number: 5,912,480
[45] Date of Patent: Jun. 15, 1999

[54] HETEROJUNCTION SEMICONDUCTOR DEVICE

[75] Inventors: Yu Zhu, Soraku-gun; Yoshiteru Ishimaru, Tenri; Naoki Takahashi, Nara; Masafumi Shimizu, Nara-ken, all of Japan

[73] Assignee: Sharp Kabushiki Kaisha, Osaka, Japan

[21] Appl. No.: 08/665,510

[22] Filed: Jun. 18, 1996

[30] Foreign Application Priority Data

Jun. 22, 1995 [JP] Japan .................................. 7-156567

[51] Int. Cl.⁶ ............................................... H01L 31/0328
[52] U.S. Cl. ...................... 257/194; 257/191; 257/192; 257/471; 257/472
[58] Field of Search ................................ 257/192, 194, 257/191, 189, 471, 472, 475, 476, 478

[56] References Cited

U.S. PATENT DOCUMENTS

| | | | |
|---|---|---|---|
| 4,484,207 | 11/1984 | Nishizawa et al. ...................... | 257/192 |
| 5,608,239 | 3/1997 | Miyamoto et al. ...................... | 257/194 |
| 5,635,735 | 6/1997 | Miyamoto et al. ...................... | 257/192 |

FOREIGN PATENT DOCUMENTS 5-160161  6/1993  Japan .

OTHER PUBLICATIONS

Brownm J.J. et al., "InP–Based HEMTs with $Al_xIn_{1-x}P$ Schottky Barrier Layers Grown by Gas–Source MBE" *InP and Related Materials Conference*, Santa Barbara, California, USA (1994) pp. 419–422.

Mishra, U.K. et al., "Microwave Performance of AlInAs-–GaInAs HEMT's with 0.2–and 0.1–$\mu$m Gate Length" *IEEE Electron Device Letters* (1988) 9(12):647–649.

Sze, S.M. *Physics of Semiconductor Devices*, Second Edition (1981) pp. 258–259.

Miller, T.J. et al., "Schottky barrier height modification on n–and p–type GaInP with thin interfacial Si" *J. Appl. Phys.* (1994) 76(12):7931–7934.

*Primary Examiner*—Sara Crane
*Attorney, Agent, or Firm*—Morrison & Foerster, LLP

[57] ABSTRACT

A heterojunction semiconductor device includes a first Schottky contact layer made of a first semiconductor, a second Schottky contact layer made of a second semiconductor and a metal electrode. The first Schottky contact layer, the second Schottky contact layer and the metal electrode are laminated in this order on a semiconductor substrate or on a main structure of a semiconductor device laminated on a semiconductor substrate from the substrate side or from the main structure side. The first Schottky contact layer serves as a barrier layer toward the second Schottky contact layer, and a layer thickness of the second Schottky contact layer is greater than the mean free pass of carriers in the second Schottky contact layer.

44 Claims, 8 Drawing Sheets

FIG. 3

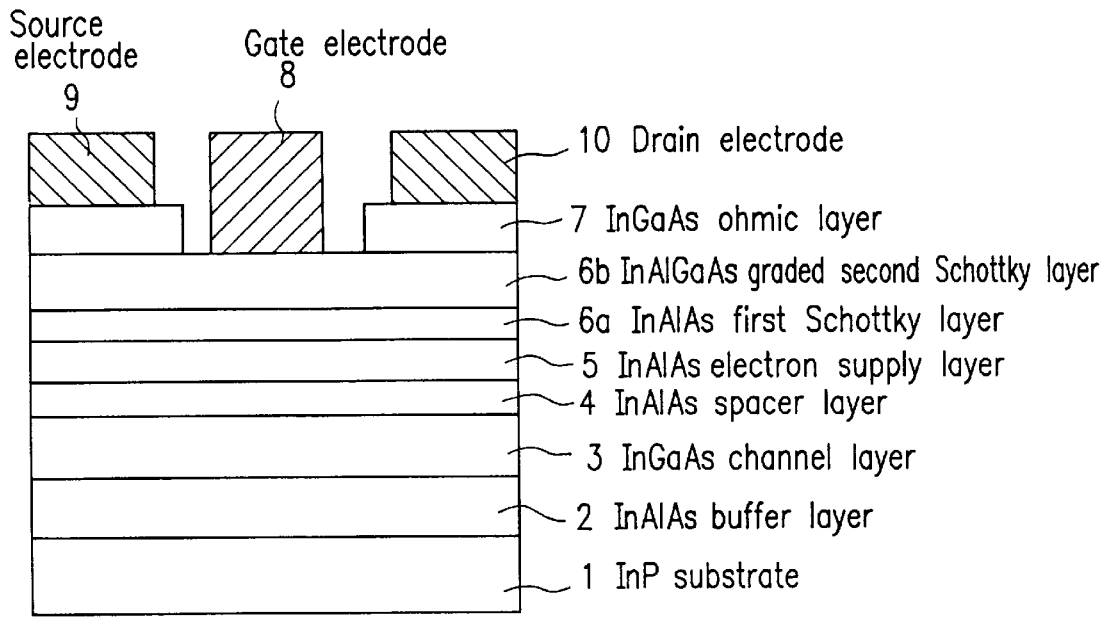

- 10 Drain electrode
- 7 InGaAs ohmic layer
- 6b InAlGaAs graded second Schottky layer
- 6a InAlAs first Schottky layer
- 5 InAlAs electron supply layer
- 4 InAlAs spacer layer
- 3 InGaAs channel layer
- 2 InAlAs buffer layer
- 1 InP substrate

FIG. 4

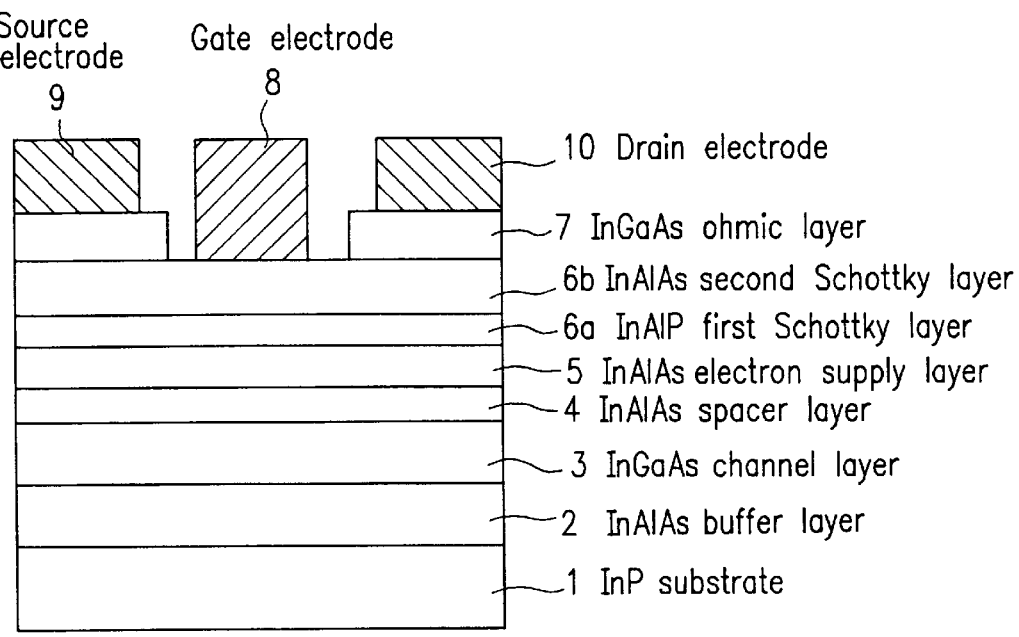

- 10 Drain electrode
- 7 InGaAs ohmic layer
- 6b InAlAs second Schottky layer
- 6a InAlP first Schottky layer
- 5 InAlAs electron supply layer
- 4 InAlAs spacer layer
- 3 InGaAs channel layer
- 2 InAlAs buffer layer
- 1 InP substrate

HETEROJUNCTION SEMICONDUCTOR DEVICE

BACKGROUND OF THE INVENTION

1. Field of the Invention

The present invention relates to a Schottky barrier diode and a heterojunction semiconductor device employing a Schottky junction.

2. Description of the Related Art

Examples of semiconductor devices include the above-mentioned Schottky barrier diode (referred to as an SBD hereinafter) or those employing Schottky junctions such as metal-semiconductor field effect transistors (referred to as an MESFET hereinafter), high electron mobility transistors (referred to as an HEMT hereinafter) and metal-semiconductor-metal light receiving elements (referred to as an MSM hereinafter). In order to obtain excellent device characteristics, such semiconductor devices employing Schottky junctions are required to have a Schottky junction which has small leakage current.

Current passing through the Schottky junction depends on the height of the barrier. It is a known fact that the higher the barrier is, the smaller the leakage current becomes. Therefore, in the prior art, attempts have been made to reduce the leakage current by increasing the barrier height. For example, a structure has been suggested where, a Schottky contact layer (referred to as a Schottky layer hereinafter) made of a single layer or double layers is provided between a semiconductor operating layer and a metal electrode in order to increase the barrier height in a case where the semiconductor operating layer is made of a material having a low Schottky barrier height. Usually, the Schottky layer is made of a semiconductor having a high Schottky barrier and its thickness is made thinner than the depletion layer of the Schottky junction formed after the insertion of the Schottky layer.

A semiconductor device having a Schottky layer made of a single layer is disclosed, for example, in "InP and Related Material Conf., SantaBarbara, USA, p419, 1994". FIG. 13 illustrates a cross-sectional structure of this semiconductor device (prior art example 1). The semiconductor device is configured as follows. An InAlAs buffer layer 102, an InGaAs channel layer 103, an InAlAs spacer layer 104 and an InAlAs electron supply layer 105 are laminated in this order on an InP substrate 101. An InAlAs first Schottky layer 106a is laminated thereon, and a couple of InGaAs ohmic contact layers 107 (referred to as an ohmic layer hereinafter) separated from each other are further formed thereon. A gate electrode 108 is formed on the exposed part of the first Schottky layer 106a, and a source electrode 109 and a drain electrode 110 are formed on each of the ohmic layers 107, respectively.

It has been reported that in prior art example 1 of this disclosure, gate leakage current can be reduced by forming the InAlAs Schottky layer 106a with respect to the InGaAs channel layer 103. However, this semiconductor device has a problem in that the leakage current is still large as compared to an HEMT made of AlGaAs/GaAs.

In order to further reduce the leakage current, a semiconductor device having a Schottky layer of double layer structure (prior art example 2) has been proposed (for example, IEEE Electron Device Lett., December 1988, Vol. 9, No. 12, p647; and Japanese Laid-Open Patent Publication No. 5-160161). FIG. 14 illustrates a cross-sectional structure of this semiconductor device. The semiconductor device includes an InAlAs buffer layer 102, an InGaAs channel layer 103, an InAlAs spacer layer 104 and an InAlAs electron supply layer 105 laminated in this order on an InP substrate 101. A Schottky layer of double layer structure made of an InAlAs first Schottky layer 106a and an InAlP second Schottky layer 106b is formed thereon, and a couple of InGaAs ohmic layers 107 separated from each other are further formed thereon. A gate electrode 108 is formed on the exposed part of the second Schottky layer 106b, and a source electrode 109 and a drain electrode 110 are formed on each of the ohmic layers 107, respectively.

In prior art example 2, it was observed that the leakage current was reduced by using the Schottky layer of double structure made of the InAlAs first Schottky layer 106a and the InAlP second Schottky layer 106b. In this example, since the InAlP was in a state of lattice mismatch with the InP substrate, its thickness was chosen to be equal to or less than the critical film thickness so as to obtain a strained layer without any dislocation.

FIGS. 7A, 7B and 7C illustrate energy band structures of the Schottky junction which has a Schottky layer of double layer structure and is made of an n-type semiconductor layer and a metal electrode. Hereinafter, a difference between the Fermi level $E_F$ of a metal constituting the metal electrode and the highest point in the conduction band of the semiconductor layer will be referred to as the barrier height and designated by $\Phi b$. Moreover, Ec designates the energy level at the bottom of the conduction band, $\Delta Ec$ designates discontinuity in the conduction band between the second Schottky layer and the first Schottky layer, Vi designates a voltage drop in the second Schottky layer, d designates the layer thickness of the second Schottky layer and $\Phi b1$ designates the barrier height between the metal electrode and the second Schottky layer. Furthermore, a value calculated from the following equations (1) and (2) while applying the thermionic emission model (S. M. Sze, "Physics of Semiconductor Devices", New York, Wiley. 1981, p.258) to the Schottky junction, referring to current and temperature characteristics of the Schottky junction, is referred to as the effective barrier height and designated by $\Phi b^{eff}$.

$$J=Js[\exp (qV/kT)-1] \tag{1}$$

$$Js=A^*T^2\exp (-q\Phi_b^{eff}/kT) \tag{2}$$

where A* is effective Richardson constant, T is an absolute temperature, q is an electronic charge and k is Boltzmann's constant.

In a Schottky layer which is made of two semiconductor layers having different electron affinities such as the one illustrated in FIGS. 7A, 7B and 7C, the layer to the metal electrode side is referred to as an upper layer and the layer to the semiconductor operating layer side is referred to as a lower layer.

A relationship between the barrier height and the electron affinity in the semiconductor layer in such a Schottky layer of double layer structure is disclosed in the Journal of Applied Physics, December 1994, Vol. 76, No. 12, p7931 to p7934. According to this reference, neglecting a mirror effect, if the upper layer is formed of a semiconductor layer which has smaller electron affinity than that of the semiconductor layer used for the lower layer, then the barrier height does not depend on a bias voltage as illustrated in FIG. 7A. On the other hand, if the upper layer is formed of a semiconductor layer which has larger electron affinity than that of the semiconductor layer used for the lower layer, the barrier height does depend on a bias voltage as illustrated in FIGS. 7B and 7C and the following equations (3) and (4).

$$\Phi_b = \Phi_{b1} + \Delta Ec - Vi (\Delta Ec > Vi) \quad (3)$$

$$\Phi_b = \Phi_{b1} (\Delta Ec < Vi) \quad (4)$$

When the carrier concentration is high or a backward bias voltage is being applied, electric field intensity inside the depletion layer increases and a relation $\Delta Ec<Vi$ results, and consequently, a barrier between the upper layer and the lower layer due to $\Delta Ec$ does not contribute to the Schottky barrier height. Therefore, in order to obtain a noticeable effect of increasing the Schottky barrier height by employing double layer structure, it is necessary to use a semiconductor layer having small electron affinity for the upper layer.

As described above, when the prior art Schottky layer is used, the following problems arise.

First, since the prior art Schottky layer of double layer structure poses a restriction that a semiconductor layer having small electron affinity be used for the upper layer, there is a possibility that some sort of inconvenience results during crystalline growth or in production processes for the device. For example, in a case where a Schottky layer of double layer structure made of an $In_{0.75}Al_{0.25}P$ layer and an $In_{0.52}Al_{0.48}As$ layer is to be formed between an InGaAs operating layer and a metal electrode formed on an InP substrate, the prior art Schottky layer requires that the $In_{0.75}Al_{0.25}P$ layer having smaller electron affinity be used for the upper layer. This reduces the leakage current. However, when heat treatment at 350° C. for one minute was performed on such device, considerable deterioration of the Schottky characteristics was observed. This is believed to be a result of the diffusion of the metal constituting the metal electrode into the semiconductor layer. Consequently, in order to improve the thermal stability of the Schottky junction, it is necessary to increase the layer thickness of the upper layer adjacent to the metal layer. On the other hand, since the $In_{0.75}Al_{0.25}P$ is in a relation of lattice mismatch with the InP, its thickness must be equal to or less than the critical film thickness. The critical film thickness of the $In_{0.75}Al_{0.25}P$ is about 11 nm. If the film thickness exceeds this, then dislocations occur in the strained layer, resulting in deterioration of the Schottky characteristics. Therefore, in the prior art Schottky layer of double layer structure, the thermal stability of the Schottky junction cannot be improved by increasing the film thickness of the upper layer.

Secondly, although the leakage current in the prior art Schottky layer can be reduced by increasing the barrier height regardless of whether it is of the single layer structure or double the layer structure, if the leakage current is to be reduced further, there are no alternatives but to use semiconductor layers having smaller electron affinity. Practically, the reduction of leakage current in the prior art Schottky layer depends on developments of new materials. However, due to limitations concerning crystalline growth or in processes for device production, materials which can actually be used are considerably limited. Therefore, it is very difficult to further reduce the leakage current in the prior art.

SUMMARY OF THE INVENTION

According to one aspect of the present invention, a heterojunction semiconductor device includes a first Schottky contact layer made of a first semiconductor, a second Schottky contact layer made of a second semiconductor, and a metal electrode. The first Schottky contact layer, the second Schottky contact layer and the metal electrode are laminated in this order on a semiconductor substrate or on a main structure of a semiconductor device laminated on a semiconductor substrate from the substrate side or from the main structure side. The first Schottky contact layer serves as a barrier layer toward the second Schottky contact layer, and a layer thickness of the second Schottky contact layer is greater than the mean free pass of carriers in the second Schottky contact layer.

In one embodiment of the present invention, the second Schottky contact layer is of such thickness that it is possible to heat up or cool down electrons in a semiconductor layer even when a lattice temperature is constant.

In one embodiment of the present invention, the second Schottky layer is larger than the first Schottky layer.

In one embodiment of the present invention, a barrier of $\Delta Ec$ is formed between the second layer and the first layer. The kinetic energy of part of the electrons reaching an interface between the second layer and the first layer is less than $\Delta Ec$.

In one embodiment of the present invention, the second layer has an electron affinity higher than the first layer.

In one embodiment of the present invention, the first layer includes non-doped $In_{0.52}Al_{0.48}As$ and has a film thickness of about 10 nm, the second layer includes non-doped $In_{0.52}Al_xGa_{1-x}As$ and has a film thickness of about 20 nm, and the composite ratio x continuously increases from x=0.24 to x=0.48.

In one embodiment of the present invention, the first layer includes non-doped $In_{0.75}Al_{0.25}P$ and has a film thickness of about 10 nm, the second layer includes non-doped $In_{0.52}Al_xGa_{1-x}As$ and has a film thickness of about 20 nm, and the composite ratio x continuously increases from x=0.24 to x=0.48.

In one embodiment of the present invention, the heterojunction semiconductor device is used in an SBD.

In one embodiment of the present invention, the heterojunction semiconductor device is used in an MESFET.

In one embodiment of the present invention, the heterojunction semiconductor device is used in an MSM.

In one embodiment of the present invention, the heterojunction semiconductor device is used in an HEMT.

According to another aspect of the present invention, a heterojunction semiconductor device includes a first Schottky contact layer made of a first semiconductor, a second Schottky contact layer made of a second semiconductor, a third Schottky contact layer made of a third semiconductor and a metal electrode. The first Schottky contact layer, the second Schottky contact layer, the third Schottky contact layer and the metal electrode are laminated in this order on a semiconductor substrate or on a main structure of a semiconductor device laminated on a semiconductor substrate from the substrate side or from the main structure side. The first Schottky contact layer and the third Schottky contact layer serve as a barrier layer toward the second Schottky contact layer, and a layer thickness of the second Schottky contact layer is greater than the mean free pass of carriers in the second Schottky contact layer.

In one embodiment of the present invention, the electron affinity of the second layer is larger than that of the first layer and the third layer.

In one embodiment of the present invention, a barrier of $\Delta Ec$ is formed between the second layer and the first layer. The kinetic energy of part of the electrons reaching an interface between the second layer and the first layer is less than $\Delta Ec$.

In one embodiment of the present invention, the composite ratio of the semiconductor in the second layer is varied such that an energy band gap of the second layer increases steadily from the first layer side toward the metal electrode.

In one embodiment of the present invention, the first layer includes non-doped $In_{0.52}Al_{0.48}As$ and has a film thickness of about 10 nm, the second layer includes non-doped $In_{0.52}Al_{0.24}Ga_{0.24}As$ and has a film thickness of about 10 nm, and the third layer includes non-doped $In_{0.52}Al_{0.48}As$ and has a film thickness of about 10 nm.

In one embodiment of the present invention, the first layer includes non-doped $In_{0.52}Al_{0.48}As$ and has a film thickness of about 10 nm, the second layer includes non-doped $In_{0.52}Al_{0.24}Ga_{0.24}As$ and has a film thickness of about 10 nm, and the third layer includes non-doped $In_{0.75}Al_{0.25}P$ and has a film thickness of about 10 nm.

In one embodiment of the present invention, the first layer includes non-doped $In_{0.52}Al_{0.48}As$ and has a film thickness of about 10 nm, the second layer includes non-doped $In_{0.52}Al_{0.24}Ga_{0.24}As$ and has a film thickness of about 10 nm, and the third layer includes non-doped $In_{0.75}Al_{0.25}P$ and has a film thickness of about 10 nm.

In one embodiment of the present invention, the first and third layers include any of $In_xGa_yAl_{1-x-y}P$ or $In_xAl_{1-x}As$ or $Ga_xAl_{1-x}As_ySb_{1-y}$, and the second layer includes any of $In_xGa_{1-x}As_yP_{1-y}$ or $GaAs_xSb_yP_{1-x-y}$.

In one embodiment of the present invention, the heterojunction semiconductor device is used in an SBD.

In one embodiment of the present invention, the heterojunction semiconductor device is used in an MESFET.

In one embodiment of the present invention, the heterojunction semiconductor device is used in an MSM.

In one embodiment of the present invention, the heterojunction semiconductor device is used in an HEMT.

According to still another aspect of the present invention, a heterojunction semiconductor device includes a first Schottky contact layer made of a first semiconductor, a second Schottky contact layer made of a second semiconductor and a metal electrode. The first Schottky contact layer, the second Schottky contact layer and the metal electrode are laminated in this order on a semiconductor substrate or on a main structure of a semiconductor device laminated on a semiconductor substrate from the substrate side or from the main structure side. A composite ratio of semiconductor of the second Schottky contact layer varies in such a manner that a energy band gap of the second Schottky contact layer increases continuously or discretely starting with the first Schottky contact layer side toward the metal electrode side. The first Schottky contact layer serves as a barrier layer toward at least a part of the second Schottky contact layer adjacent to the first Schottky contact layer, and a layer thickness of the second Schottky contact layer is greater than the mean free pass of carriers in the second Schottky contact layer.

In one embodiment of the present invention, the second Schottky contact layer is of such thickness that it is possible to heat up or cool down electrons in a semiconductor layer even when a lattice temperature is constant.

In one embodiment of the present invention, the second Schottky layer is larger than the first Schottky layer.

In one embodiment of the present invention, a barrier of $\Delta Ec$ is formed between the second layer and the first layer. The kinetic energy of part of the electrons reaching an interface between the second layer and the first layer is less than $\Delta Ec$.

In one embodiment of the present invention, the second layer has an electron affinity higher than the first layer.

In one embodiment of the present invention, the first layer includes non-doped $In_{0.52}Al_{0.48}As$ and has a film thickness of about 10 nm, the second layer includes non-doped $In_{0.52}Al_xGa_{1-x}As$ and has a film thickness of about 20 nm, and the composite ratio x continuously increases from x=0.24 to x=0.48.

In one embodiment of the present invention, the first layer includes non-doped $In_{0.75}Al_{0.25}P$ and has a film thickness of about 10 nm, the second layer includes non-doped $In_{0.52}Al_xGa_{1-x}As$ and has a film thickness of about 20 nm, and the composite ratio x continuously increases from x=0.24 to x=0.48.

According to still another aspect of the present invention, a heterojunction semiconductor device includes a Schottky contact layer including a plurality of first semiconductor layers made of a first semiconductor and a plurality of second semiconductor layers made of a second semiconductor, the plurality of first semiconductor layers and the plurality of second semiconductor layers being alternately laminated, and a metal electrode. The Schottky contact layer and the metal electrode are laminated in this order on a semiconductor substrate or on a main structure of a semiconductor device laminated on a semiconductor substrate from the substrate side or from the main structure side. The first semiconductor layers serve as a barrier layer toward the second semiconductor layers, and a layer thickness of the second semiconductor layer is greater than the mean free pass of carriers in the second semiconductor layer.

In one embodiment of the present invention, the main structure of the semiconductor device includes a buffer layer, a channel layer, a spacer layer and an electron supply layer.

Thus, the invention described herein makes possible the advantages of (1) providing a heterojunction semiconductor device in which the leakage current can be reduced as in a prior art Schottky layer and inconvenience during crystalline growth or in processes for device production can be avoided, and (2) a heterojunction semiconductor device in which smaller leakage current can be achieved even if a semiconductor layer having the same barrier height is used.

These and other advantages of the present invention will become apparent to those skilled in the art upon reading and understanding the following detailed description with reference to the accompanying figures.

BRIEF DESCRIPTION OF THE DRAWINGS

FIG. 3 is a cross-sectional view illustrating a heterojunction semiconductor device in Example 3.

FIG. 4 is a cross-sectional view illustrating a heterojunction semiconductor device in Example 4.

DESCRIPTION OF THE PREFERRED EMBODIMENTS

Hereinafter, examples of the present invention will be described.

In the present invention, the reason for forming a second Schottky layer or a second semiconductor layer where the layer thickness is larger than the mean free pass of the carrier in the layer is as follows.

Electrons in a semiconductor layer are moving at a high rate of speed in all directions while repeatedly colliding with lattice atoms or dopant impurity atoms and scattering. A distance traveled by the electron from one collision to another is referred to as the mean free pass. The mean free pass in a semiconductor such as Si and GaAs at room temperature has been reported to be about 50 angstroms.

A steady state at a certain temperature where no external stimuli are present is called thermal equilibrium. In thermal equilibrium, the temperature of electrons in the semiconductor layer is equal to that of the lattice. When an electric field is applied, the electrons are accelerated by the electric field and their kinetic energy increases, raising the temperature of the electrons. Similarly, in a heterojunction structure, when electrons enter the well layer from the barrier layer, part of the potential energy is converted into kinetic energy, thereby raising the temperature of the electrons. Such electrons whose temperature is higher than that of the lattice are called hot electrons. The temperature of the hot electrons decreases when they transfer some of their energy to the lattice by the collision. Therefore, in a semiconductor layer whose layer thickness is larger than the mean free pass of the carrier in the layer, it is possible to heat up or cool down only the electrons, even in a case where the lattice temperature stays constant.

The amount of current passing through a barrier of constant height depends on the kinetic energy of the carrier, that is, the temperature of the carrier. The lower the temperature of the carrier, the smaller the current is. In the prior art, since attention was only paid to increasing the barrier height, a deterioration of the Schottky characteristics resulted due to heat treatment or an increase in the layer thickness, and this limited the choice of materials. However, in the present invention, the carrier is cooled by forming the Schottky layer or the second semiconductor layer whose layer thickness is larger than the mean free pass of the carrier in the layer, provided that the device temperature is constant and the lattice temperature is constant, thereby realizing the reduction of the leakage current. Consequently, the above-mentioned problem associated with the prior art does not result.

Figure 8:
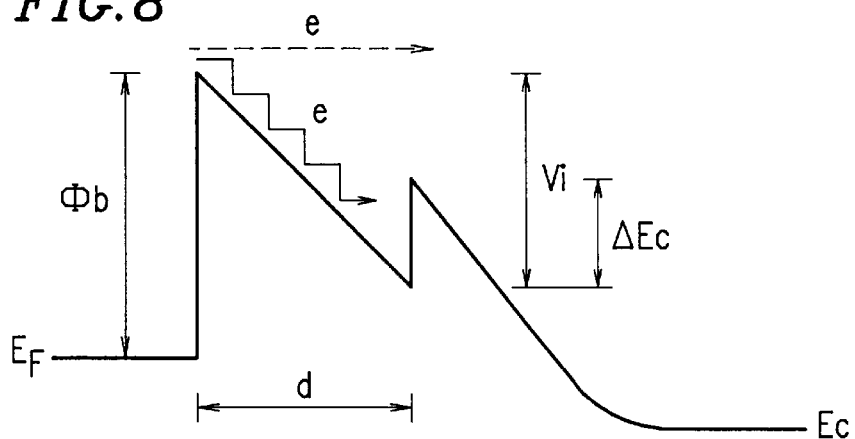
FIG. 8 is a diagram schematically illustrating the travel of electrons in the depletion layer of the Schottky junction having the Schottky layer of double layer structure.

FIG. 8 schematically illustrates the traveling of electrons in an n-type Schottky junction depletion layer. This Schottky layer is made of two semiconductor layers. Since the electron affinity of the upper layer (the second Schottky layer or the second semiconductor layer) is chosen to be larger than that of the lower layer (the first Schottky layer or the first semiconductor layer), a barrier of $\Delta Ec$ is formed between the upper layer and the lower layer. In such a Schottky junction, $\Delta Ec$ does not usually contribute to the Schottky barrier when $\Delta Ec<Vi$ as described in the prior art.

Hereinafter, an influence of $\Delta Ec$ on the leakage current will be considered for such Schottky layer. When the layer thickness d of the upper layer is smaller than the mean free pass of the electrons in the layer, the scattering of the electrons in the upper layer can be ignored and, consequently, the cooling of the electrons can be ignored. In this case, since the kinetic energy of the electrons reaching the interface between the upper layer and the lower layer is greater than $\Delta Ec$ as illustrated by the broken line in FIG. 8, $\Delta Ec$ does not contribute to the reduction of the leakage current.

However, when the layer thickness d of the upper layer is greater than the mean free pass of the electrons in the layer, the scattering of the electrons in the upper layer can no longer be ignored and, consequently, the cooling of the electrons cannot be ignored, either. As illustrated by the solid line in FIG. 8, since some of the energy of the hot electrons are transferred to the lattice by the collisions and, therefore, the kinetic energy of part of the electrons reaching the interface between the upper layer and the lower layer become less than $\Delta Ec$, that part of the electrons is reflected by the barrier at the interface between the upper layer and the lower layer. As a result, $\Delta Ec$ contributes to the increase of the effective Schottky barrier height and the leakage current is reduced accordingly. Therefore, it is considered that when the layer thickness d of the upper layer is chosen to be larger than the mean free pass of the electrons in the upper layer, the effective Schottky barrier equivalent to the barrier which would be obtained when a layer having small electron affinity were used for the upper layer can be obtained even in the case where electron affinity of the upper layer is greater than that of the lower layer, thereby reducing the leakage current.

Figure 9:
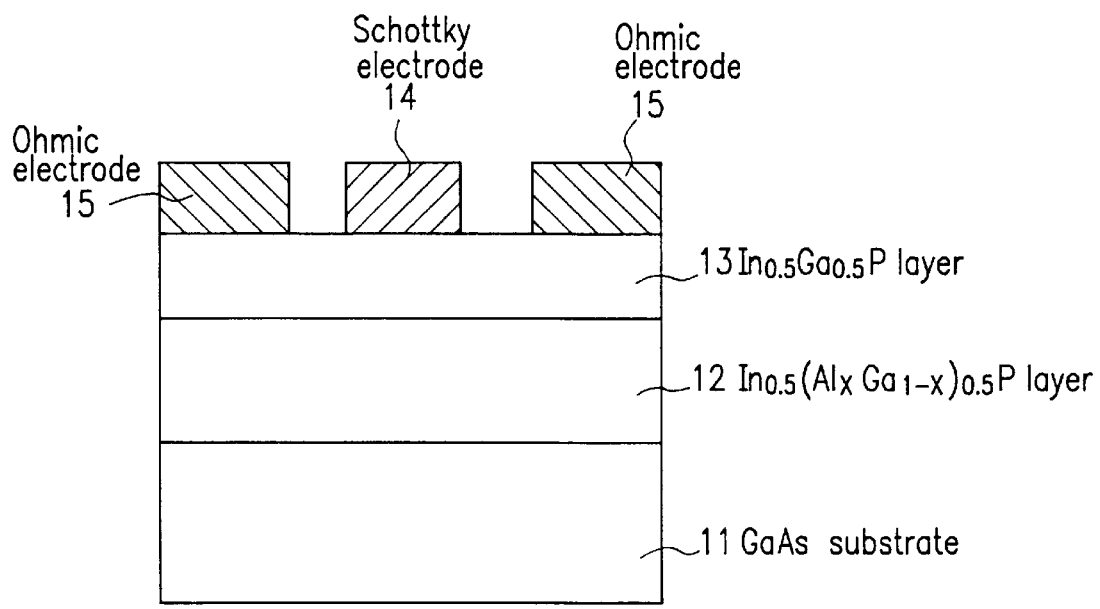
FIG. 9 is a cross-sectional view illustrating the structure of the Schottky junction having the $In_{0.5}Ga_{0.5}P/In_{0.5}(Al_xGa_{1-x})_{0.5}P$ Schottky layer.
Figure 10:
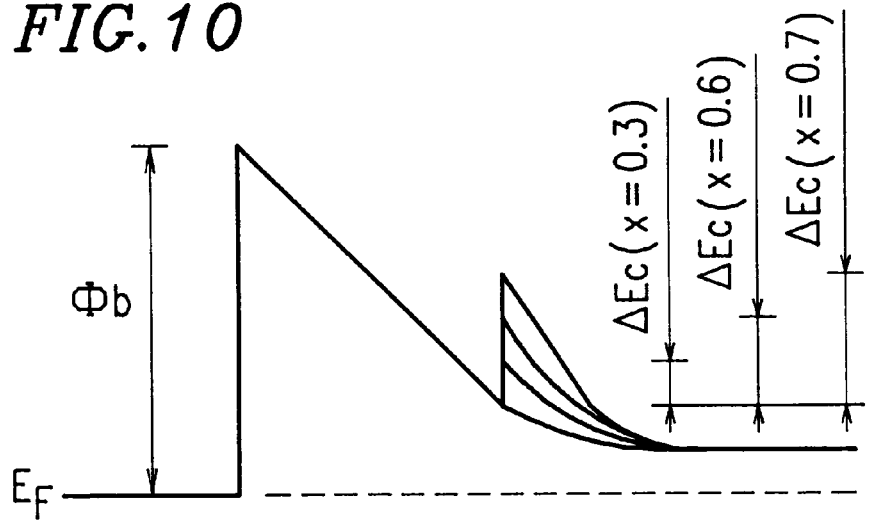
FIG. 10 is a diagram illustrating the energy band structure of the Schottky junction having the $In_{0.5}Ga_{0.5}P/In_{0.5}(Al_xGa_{1-x})_{0.5}P$ Schottky layer.

In order to confirm the above consideration, a Schottky junction of double layer structure including the upper layer made of $In_{0.5}Ga_{0.5}P$ and the lower layer made of $In_{0.5}(Al_xGa_{1-x})_{0.5}P$ was produced. Then, current-voltage characteristics were measured in a temperature range of 230 K to 420 K, and the effective barrier height was calculated using the thermionic emission model. FIG. 9 illustrates the epitaxial structure and FIG. 10 illustrates the energy band structure of this Schottky junction. This Schottky junction was formed by a Schottky layer which was made of an $In_{0.5}(Al_xGa_{1-x})_{0.5}P$ layer 12 and an $In_{0.5}Ga_{0.5}P$ layer 13 and was formed on a GaAs substrate 11. A Schottky electrode 14 and two ohmic electrodes 15 isolated from each other were formed thereon. For this Schottky layer, the composite ratio of Al of the lower layer was taken to be x=0, 0.3, 0.6 and 0.7. Moreover, the mean free pass for the electrons in the upper layer was about several tens of angstroms and the thickness of the upper layer was set at about 170 angstroms. Furthermore, in order to increase the voltage drop in the upper layer so that $\Delta Ec<Vi$ was satisfied, the carrier concentration in the upper layer and the lower layer was set at $1\times10^{18}$ cm$^{-3}$.

As disclosed in Appl. Phys. Lett., April 1987, Vol. 50, No. 14, p906 to p908, the electron affinity becomes small as the composite ratio x of Al of the $In_{0.5}(Al_xGa_{1-x})_{0.5}P$ becomes large, provided that x<0.7. As a result, the larger the x is, the larger the barrier height becomes at the hetero interface between the $In_{0.5}Ga_{0.5}P$ layer and the $In_{0.5}(Al_xGa1_{1-x})_{0.5}P$ layer in the range of x<0.7 as illustrated in FIG. 10. Therefore, it can be confirmed whether or not the ΔEc contributes to the effective Schottky barrier by measuring the dependency of the effective Schottky barrier height of the $In_{0.5}Ga_{0.5}P$ layer/the $In_{0.5}(Al_xGa1_{1-x})_{0.5}P$ layer on the composite ratio of Al.

Figure 11:
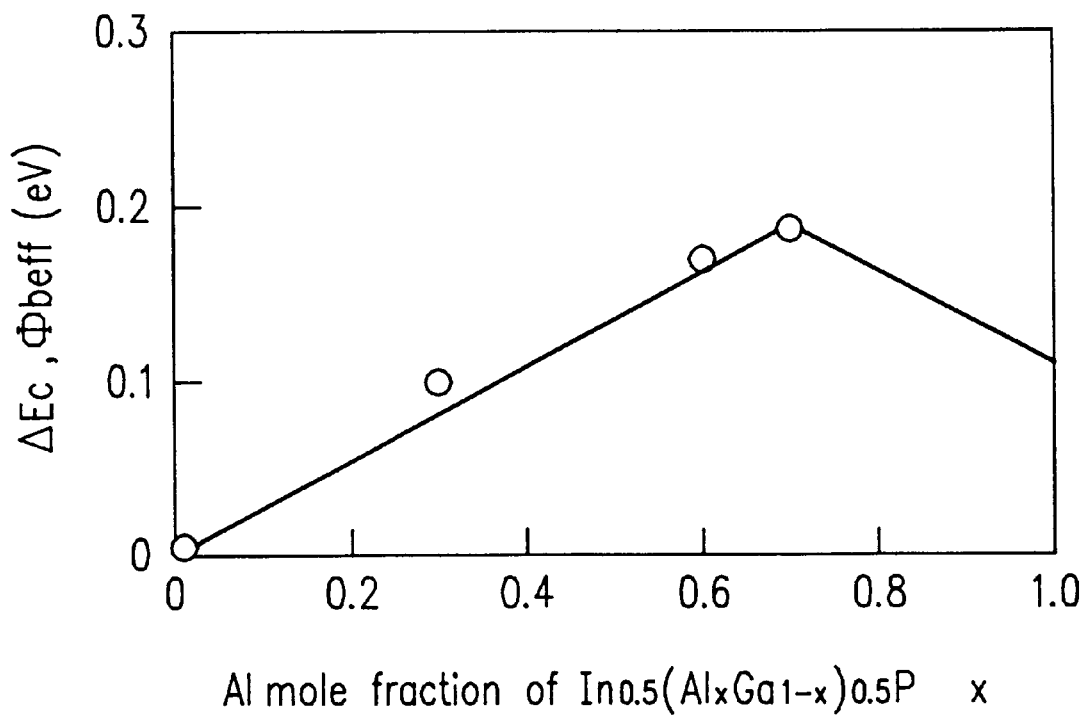
FIG. 11 is a graph illustrating dependency of the effective barrier height on the composite ratio x of Al in the Schottky junction having the $In_{0.5}Ga_{0.5}P/In_{0.5}(Al_xGa_{1-x})_{0.5}P$ Schottky layer.

A result of the measurement is illustrated in FIG. 11. In the figure, the solid line indicates the dependency of the conduction band discontinuity ΔEc between the $In_{0.5}Ga_{0.5}P$ layer and the $In_{0.5}(Al_xGa1_{1-x})_{0.5}P$ layer on the composite ratio of Al according to the above-mentioned reference (Appl. Phys. Lett., April 1987, Vol. 50, No. 14, p906 to p908), and the circles indicate the dependency of the effective Schottky barrier height $\Phi b^{eff}$ on the composite ratio of Al according to the experiment performed by the inventors. As can be seen from the figure, the dependency of the effective barrier height $\Phi b^{eff}$ on the composite ratio of Al almost matches the dependency of the conduction band discontinuity ΔEc between the $In_{0.5}Ga_{0.5}P$ layer and the $In_{0.5}(Al_xGa1_{1-x})_{0.5}P$ layer on the composite ratio of Al. This experiment confirms that ΔEc contributes to an increase in the effective Schottky barrier height even in a case where ΔEc<Vi.

Therefore, in a Schottky layer of double layer structure, by using as the upper layer (a second Schottky layer) a semiconductor layer having electron affinity larger than that of a semiconductor layer used as the lower layer (a first Schottky layer), inconvenience associated with crystalline growth or production processes can be avoided. By making the layer thickness of the upper layer larger than the mean free pass of the carrier in the upper layer, an effect of reducing the leakage current equivalent to that in the prior art Schottky junction of double layer structure can be obtained.

Figure 12:
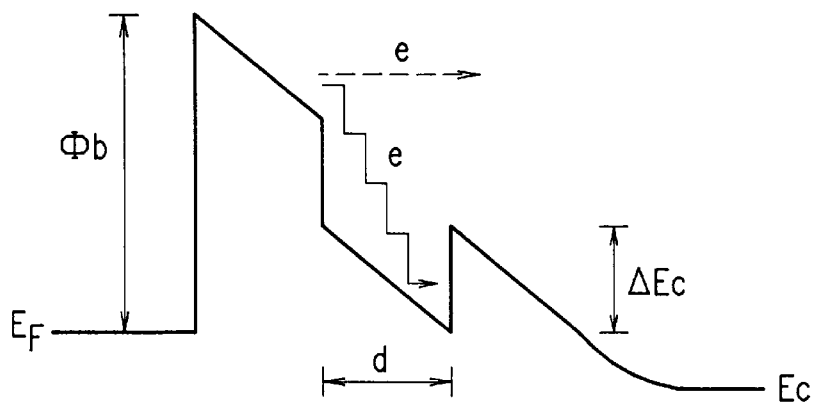
FIG. 12 is a diagram illustrating the energy band structure of the Schottky junction having the Schottky layer of triple layer structure.

Furthermore, keeping the above result in mind, the inventors invented a Schottky junction where the leakage current can be reduced much better than in the prior art Schottky layer even if a semiconductor material having the same barrier height is used. This Schottky junction is formed by a Schottky layer made of three layers, namely, the uppermost layer (the third Schottky layer), the middle layer (the second Schottky layer) and the lowermost layer (the first Schottky layer). Electron affinity of the middle layer is larger than that of the uppermost layer and the lowermost layer. As illustrated in the energy band structure of FIG. 12, the uppermost layer and the lowermost layer become the barrier layer to the middle layer. Since, when electrons enter the middle layer from the uppermost layer, the kinetic energy of the electrons suddenly increases due to a difference in the electron affinities between the uppermost layer and the middle layer and the temperature of the electrons rises, the temperature of the electron in the middle layer becomes higher than that of the lattice.

In this Schottky layer, when the layer thickness d of the middle layer is smaller than the mean free pass of the electrons in the layer, the scattering of electrons in the middle layer can be ignored. In this case, since the electrons pass through the middle layer while maintaining the temperature and the kinetic energy of the electrons reaching the interface between the middle layer and the lowermost layer is greater than ΔEc as illustrated by the broken line in FIG. 12, ΔEc does not contribute to the reduction of the leakage current. Therefore, the effective barrier height to be obtained is to the same degree as the prior art Schottky junction using the semiconductor layer having the same barrier height.

However, when the layer thickness d of the middle layer is greater than the mean free pass of the electrons in the layer, the scattering of the electrons in the middle layer can no longer be ignored. In this case, as illustrated by the solid line in FIG. 12, some of the energy of the hot electrons are transferred to the lattice by collision, thereby cooling the electrons in the middle layer, and the kinetic energy of a part of the electrons reaching the interface between the middle layer and the lowermost layer becomes less than ΔEc. As a result, ΔEc contributes to an increase of the effective Schottky barrier height and the leakage current is reduced accordingly. Therefore, an effective Schottky barrier higher than that of the prior art Schottky junction can be obtained even if a semiconductor layer having the same barrier height is used.

Instead of forming the third Schottky layer as described above, the composite ratio of the semiconductor in the second Schottky layer can be varied such that the energy band gap of the second Schottky layer increases continuously or discretely starting from the first Schottky layer side toward the metal electrode side, and a similar effect can still be obtained. Moreover, a plurality of first semiconductor layers and a plurality of second semiconductor layers having an electron affinity larger than that of the first semiconductor layers can be laminated alternately to obtain the same effect.

Hereinafter, specific examples of the present invention will be described with reference to the figures. Parts having the same functions are designated by the same reference numerals throughout the figures.

EXAMPLE 1

Figure 1:
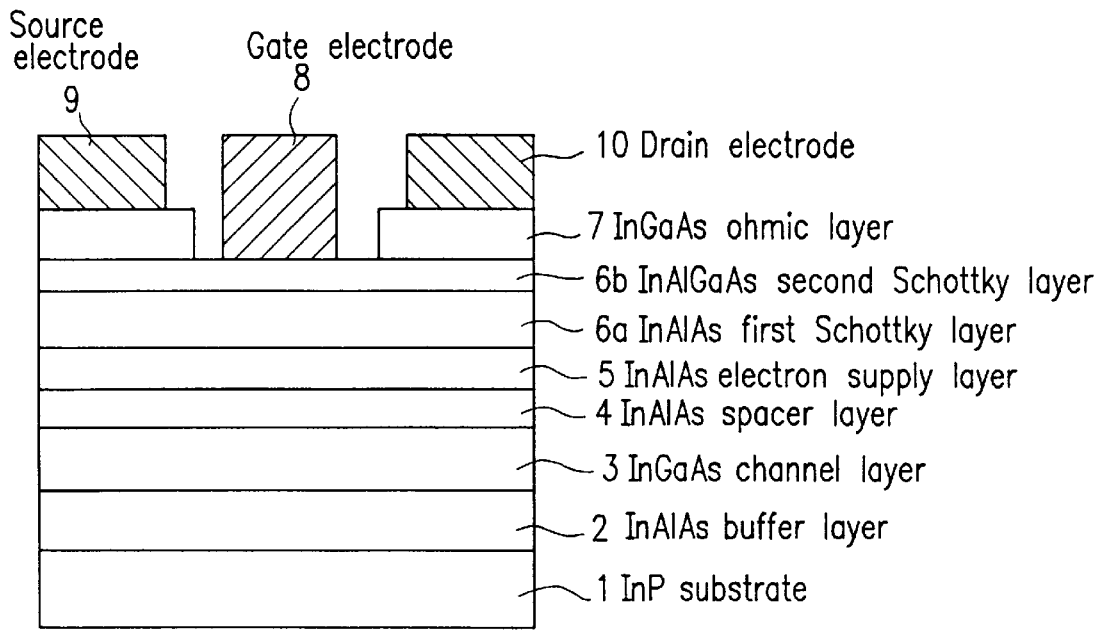
FIG. 1 is a cross-sectional view illustrating a heterojunction semiconductor device in Example 1.

FIG. 1 is a cross-sectional view illustrating the structure of a heterojunction semiconductor device in Example 1. This semiconductor device is an HEMT having the structure as follows. A non-doped $In_{0.52}Al_{0.48}As$ buffer layer 2 of 300 nm film thickness, an $In_{0.53}Ga_{0.47}As$ channel layer 3 of 20 nm film thickness, an $In_{0.52}Al_{0.48}As$ spacer layer 4 of 3 nm film thickness and an n-type $In_{0.52}Al_{0.48}As$ electron supply layer 5 of 5 nm film thickness doped to $5\times10^{18}$ cm$^{-3}$ of Si are laminated in this order on a semi-insulating InP substrate 1. Laminated thereon is a Schottky layer of double layer structure made of a non-doped $In_{0.52}Al_{0.48}As$ first Schottky layer 6a of 150 nm film thickness and a non-doped $In_{0.52}Al_{0.24}Ga_{0.24}As$ second Schottky layer 6b of 10 nm film thickness. Further formed thereon are a couple of $In_{0.53}Ga_{0.47}As$ ohmic layers 7 of 2 nm film thickness separated from each other. A TiPtAu gate electrode 8 is formed on the exposed part of the second Schottky layer 6b, and a source electrode 9 and a drain electrode 10 are formed on each of the ohmic layers 7, respectively.

Figure 13:
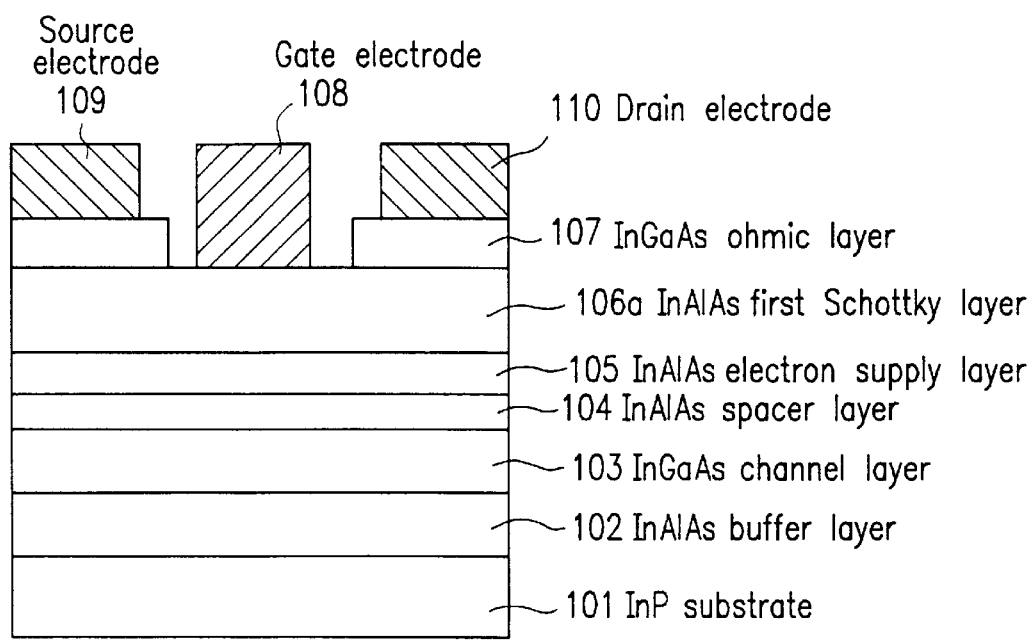
FIG. 13 is a cross-sectional view illustrating a heterojunction semiconductor device in prior art example 1.

The leakage current in the HEMT in this example is shown in Table 1 below. For purposes of comparison, the leakage current in prior art example 1 illustrated in FIG. 13 where the non-doped $In_{0.52}Al_{0.48}As$ Schottky layer was used as a single layer is shown together.

TABLE 1

| | Prior Art Example 1 | Example 1 | Example 2 | Example 3 |
|---|---|---|---|---|
| Gate leakage current density when −1 V | | | | |
| 3rd Schottky layer | | | $In_{0.52}Al_{0.48}As$ | |
| 2nd Schottky layer | | $In_{0.52}Al_{0.24}Ga_{0.24}As$ | $In_{0.52}Al_{0.24}Ga_{0.24}As$ | $In_{0.52}Al_xGa_{1-x}As$ (X = 0.24 − 0.48) |
| 1st Schottky layer | $In_{0.52}Al_{0.48}As$ | $In_{0.52}Al_{0.48}As$ | $In_{0.52}Al_{0.48}As$ | $In_{0.52}Al_{0.48}As$ |
| Current density(A/cm$^2$) | 30 | 36 | 6.4 | 7.5 |

Although, in this HEMT, the barrier height of the $In_{0.52}Al_{0.24}Ga_{0.24}As$ is less than that of the $In_{0.52}Al_{0.48}As$, leakage current similar to that in prior art example 1 was obtained due to the electron cooling effect in the $In_{0.52}Al_{0.24}Ga_{0.24}As$ second Schottky layer 6b. Moreover, since the composite ratio of Al of the epitaxial layer directly below the gate electrode 8 varies from 0.48 to 0.24, the fluctuation of Schottky characteristics was considerably reduced compared to prior art example 1.

EXAMPLE 2

Figure 2:
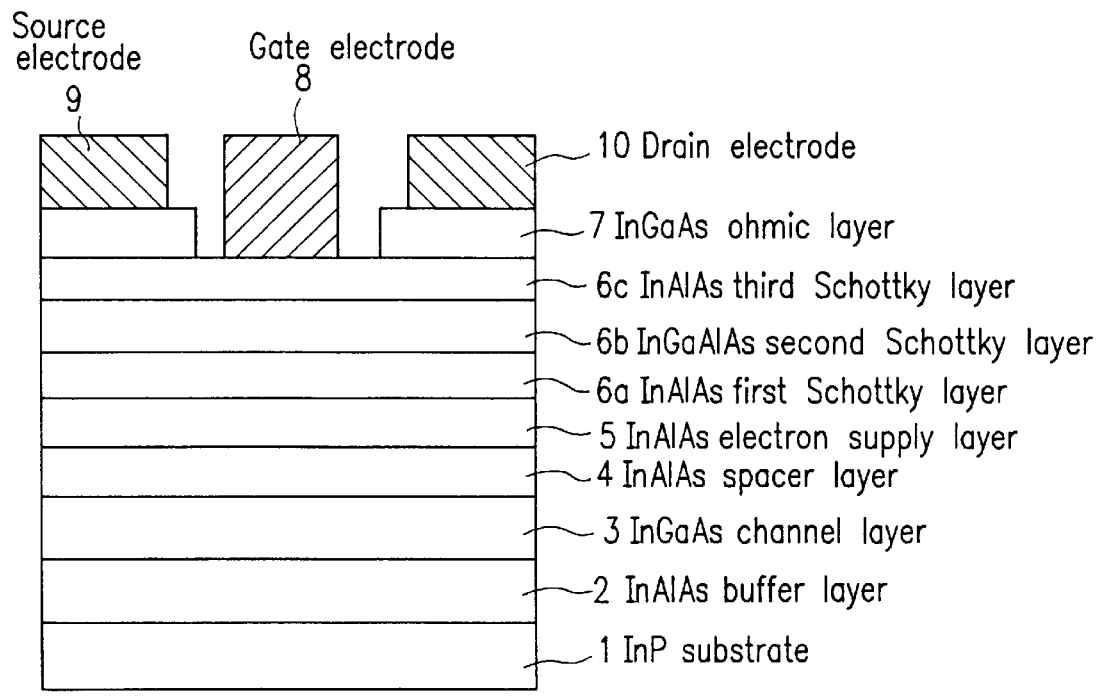
FIG. 2 is a cross-sectional view illustrating a heterojunction semiconductor device in Example 2.

FIG. 2 is a cross-sectional view illustrating the structure of a heterojunction semiconductor device in Example 2. This HEMT has a Schottky layer made of three layers, namely, a non-doped $In_{0.52}Al_{0.48}As$ first Schottky layer 6a of 10 nm film thickness, a non-doped $In_{0.52}Al_{0.24}Ga_{0.24}As$ second Schottky layer 6b of 10 nm film thickness and a non-doped $In_{0.52}Al_{0.48}As$ third Schottky layer 6c of 10 nm film thickness. The rest of the construction is similar to that in Example 1.

Figure 7A:
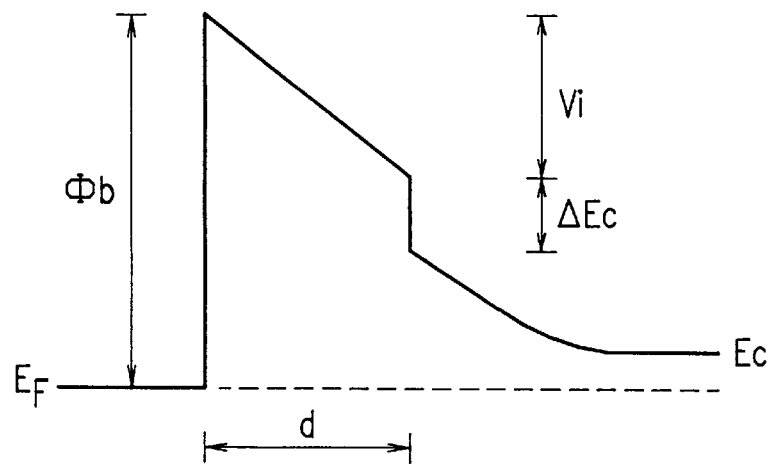
FIGS. 7A, 7B and 7C are diagrams illustrating the energy band structure of the Schottky junction having the Schottky layer of double layer structure.
Figure 7B:
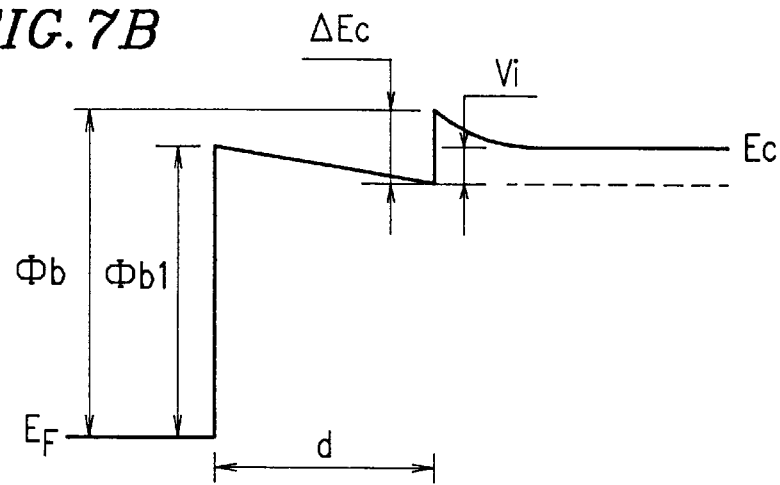
Figure 7C:
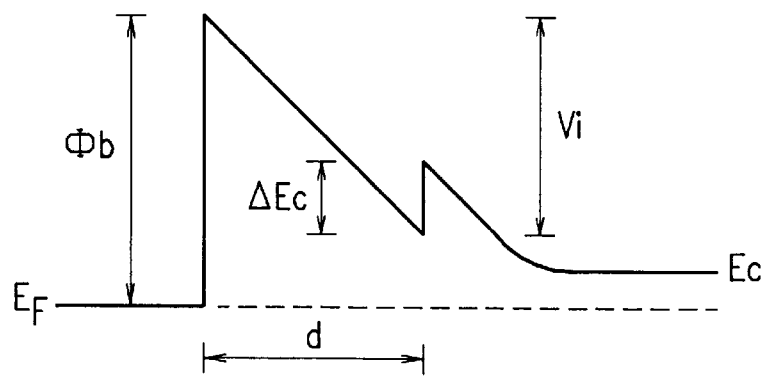

The leakage current in the HEMT in this example is also shown in the above Table 1. Although the barrier height Φb illustrated in FIGS. 7A, 7B and 7C of this HEMT is the same as that in prior art example 1, the effective barrier height was increased due to the electron cooling effect in the $In_{0.52}Al_{0.24}Ga_{0.24}As$ second Schottky layer 6b, and the leakage current was further reduced.

EXAMPLE 3

FIG. 3 is a cross-sectional view illustrating the structure of a heterojunction semiconductor device in Example 3. This HEMT has a Schottky layer made of two layers, namely, a non-doped $In_{0.52}Al_{0.48}As$ first Schottky layer 6a of 10 nm film thickness and a non-doped $In_{0.52}Al_xGa_{1-x}As$ graded second Schottky layer 6b of 20 nm film thickness. The composite ratio x of the constituent element of the second Schottky layer 6b continuously increases from x=0.24 to x=0.48 starting with the first Schottky layer 6a side toward the metal electrode side. The rest of the construction is similar to that in Example 1.

The leakage current in the HEMT in this example is also shown in the above Table 1. The leakage current similar to that in Example 2 where the Schottky layer of triple layer structure was formed was obtained due to the electron cooling effect in the $In_{0.52}Al_xGa_{1-x}As$ graded second Schottky layer 6b. The above-mentioned composite ratio x can be varied discretely to obtain the similar effect.

By the way, when growing an epitaxial layer including P such as $In_{0.75}Al_{0.25}P$, an MOCVD (metal organic chemical vapor deposition) apparatus or a gas source MBE (molecular beam epitaxy) apparatus must be used because of the purity level limitations of a solid source. However, since these apparatuses use hazardous gas as raw materials, a large amount of investment must be made in safety devices and decontaminating devices. Since the epitaxial layer including P is not used either in Example 2 or in Example 3, the epitaxial layer can be produced by a solid source MBE apparatus, thereby reducing the leakage current at low cost.

EXAMPLE 4

FIG. 4 is a cross-sectional view illustrating the structure of the heterojunction semiconductor device in Example 4. This HEMT has a Schottky layer made of two layers, namely, a non-doped $In_{0.75}Al_{0.25}P$ first Schottky layer 6a of 11 nm film thickness and a non-doped $In_{0.52}Al_{0.48}As$ second Schottky layer 6b of 15 nm film thickness. The rest of the construction is similar to that in Example 1.

Figure 14:
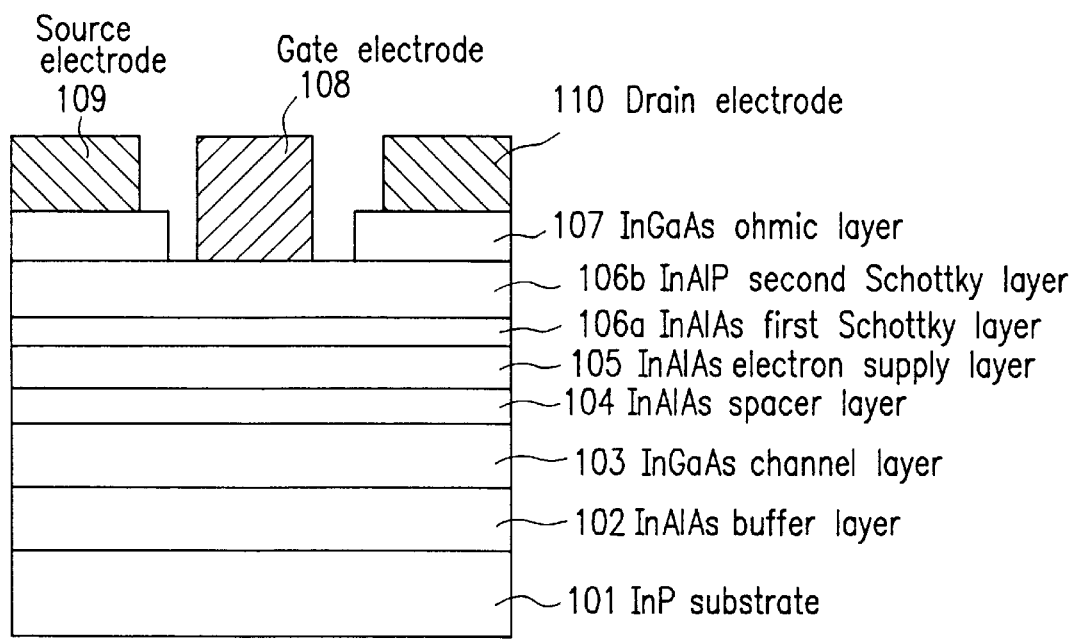
FIG. 14 is a cross-sectional view illustrating a heterojunction semiconductor device in prior art example 2.

The leakage current in the HEMT in this example is shown in Table 2 below. For purposes of comparison, the leakage current in prior art example 2 illustrated in FIG. 14 where the Schottky layer of double layer structure made of the non-doped $In_{0.52}Al_{0.48}As$ Schottky layer and the non-doped $In_{0.75}Al_{0.25}P$ Schottky layer were used are shown together.

TABLE 2

Gate leakage current density when −1 V

| | Prior Art Example 2 | Example 4 | Example 5 | Example 6 |
|---|---|---|---|---|
| 3rd Schottky layer | | | $In_{0.75}Al_{0.25}P$ | |
| 2nd Schottky layer | $In_{0.75}Al_{0.25}P$ | $In_{0.52}Al_{0.48}As$ | $In_{0.52}Al_{0.24}Ga_{0.24}As$ | $In_{0.52}Al_xGa_{1-x}As$ (X = 0.24 − 0.48) |
| 1st Schottky layer | $In_{0.52}Al_{0.48}As$ | $In_{0.75}Al_{0.25}P$ | $In_{0.52}Al_{0.48}As$ | $In_{0.75}Al_{0.25}P$ |
| Current density(A/cm$^2$) | 0.72 | 0.80 | 0.12 | 0.23 |

A similar leakage current as in prior art example 2 was obtained in this HEMT. In prior art example 2, since the gate electrode 8 made of metal is formed on the $In_{0.75}Al_{0.25}P$ layer of 11 nm film thickness, the leakage current increased from 0.72 A/cm$^2$ to 56 A/cm$^2$ due to heat treatment at 350° C. for one minute and a considerable amount of deterioration of Schottky characteristics was observed. However, since the second Schottky layer 6b of the HEMT in this example was thick, the leakage current was only increased from 0.80 A/cm$^2$ to 1.4 A/cm$^2$ by the heat treatment at 350° C. for one minute, thereby considerably improving the thermal stability.

EXAMPLE 5

Figure 5:
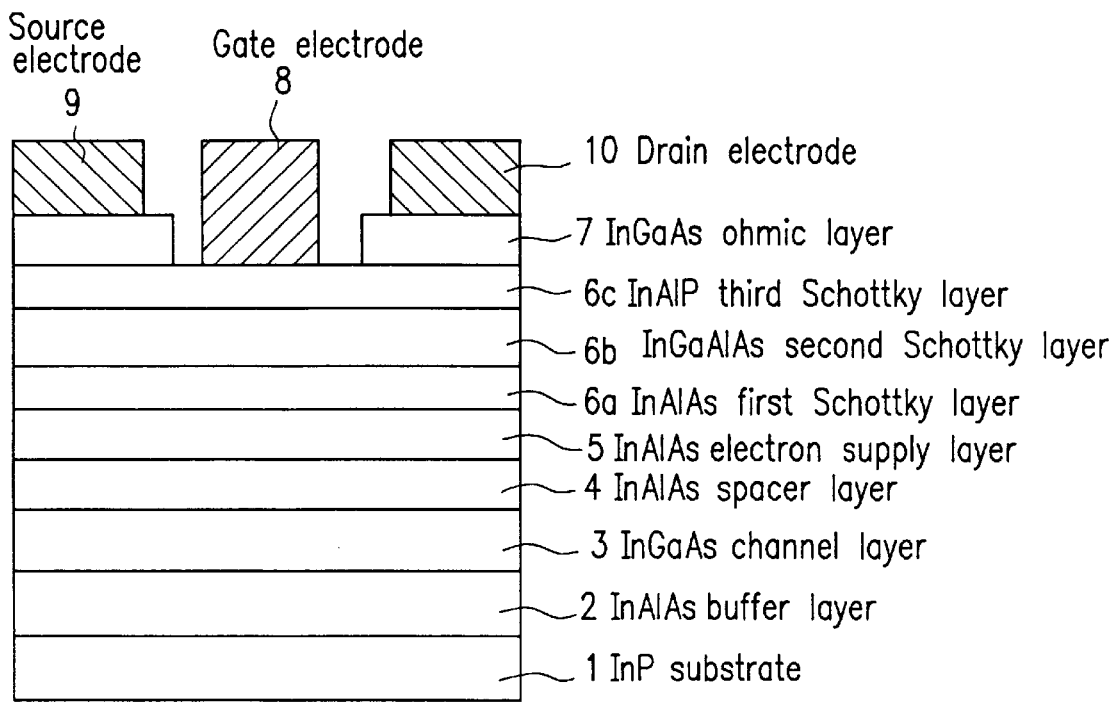
FIG. 5 is a cross-sectional view illustrating a heterojunction semiconductor device in Example 5.

FIG. 5 is a cross-sectional view illustrating the structure of a heterojunction semiconductor device in Example 5. This HEMT has a Schottky layer made of three layers, namely, a non-doped $In_{0.52}Al_{0.48}As$ first Schottky layer 6a of 10 nm film thickness, a non-doped $In_{0.52}Al_{0.24}Ga_{0.24}As$ second Schottky layer 6b of 10 nm film thickness and a non-doped $In_{0.75}Al_{0.25}P$ third Schottky layer 6c of 10 nm film thickness. The rest of the construction is similar to that in Example 1.

The leakage current of the HEMT in this example is also illustrated in the above-mentioned Table 2. The effective barrier height of this HEMT was increased due to the electron cooling effect in the $In_{0.52}Al_{0.24}Ga_{0.24}As$ second Schottky layer 6b, thereby further reducing the leakage current compared to prior art example 2.

EXAMPLE 6

Figure 6:
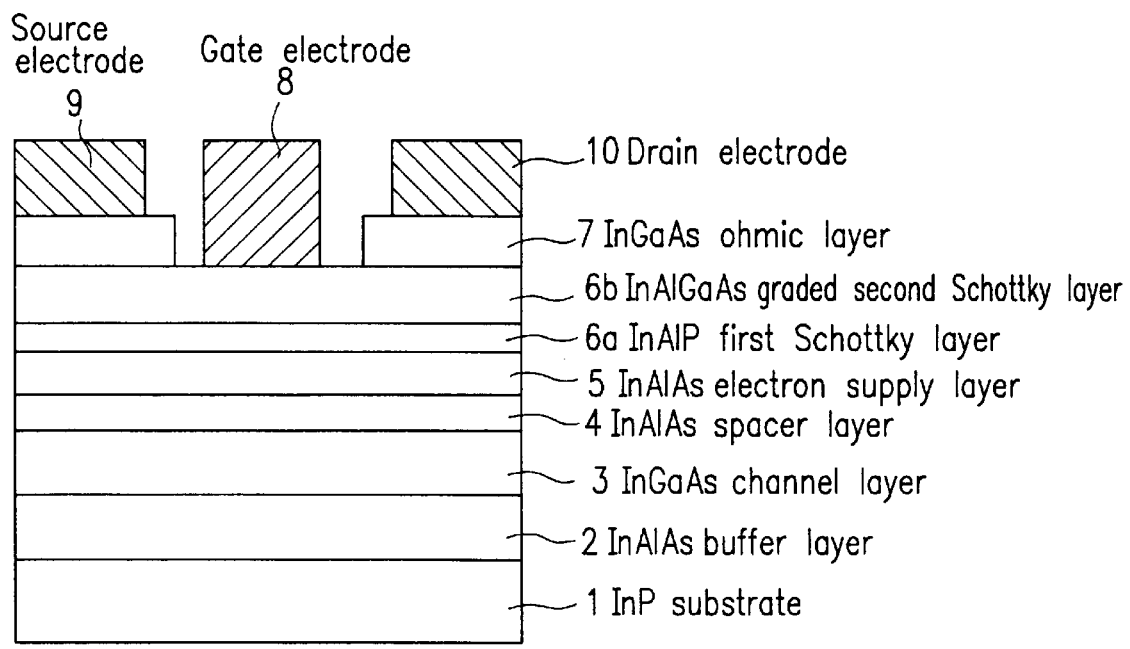
FIG. 6 is a cross-sectional view illustrating a heterojunction semiconductor device in Example 6.

FIG. 6 is a cross-sectional view illustrating the structure of a heterojunction semiconductor device in Example 6. This HEMT has a Schottky layer made of two layers, namely, a non-doped $In_{0.75}Al_{0.25}P$ first Schottky layer 6a of 10 nm film thickness and a non-doped $In_{0.52}Al_xGa_{1-x}As$ graded second Schottky layer 6b of 20 nm film thickness. The composite ratio x of the constituent element of the second Schottky layer 6b continuously increases from x=0.24 to x=0.48 starting with the first Schottky layer 6a side toward the metal electrode side. The rest of the construction is similar to that in Example 1.

The leakage current in the HEMT in this example is also shown in the above Table 2. The leakage current similar to that in Example 5 where the Schottky layer of triple layer structure was formed was obtained due to the electron cooling effect in the $In_{0.52}Al_xGa_{1-x}As$ graded second Schottky layer 6b. The above-mentioned composite ratio x can be varied discretely to obtain the similar effect.

The examples according to the present invention have so far been described. However, those examples are not to limit the scope of the present invention.

In the above-described examples, an $In_{0.75}Al_{0.25}P$ layer or an $In_{0.52}Al_{0.48}As$ layer is used as the first Schottky layer and the third Schottky layer, and an $In_{0.52}Al_{0.48}As$ layer or an $In_{0.52}Al_xGa_{1-x}As$ layer is used as the second Schottky layer. However, if the first Schottky layer and the third Schottky layer serve as a barrier layer to the second Schottky layer and the layer thickness of the second Schottky layer is greater than the mean free pass of the carrier in the second Schottky layer, then either one can be used. For example, an $In_xGa_yAl_{1-x-y}P$ layer, an $In_xAl_{1-x}As$ layer, a $Ga_xAl_{1-x}As_ySb_{1-y}$ layer or the like can be used as the first Schottky layer and the third Schottky layer, and an $In_xGa_{1-x}As_yP_{1-y}$ layer, a $GaAs_xSb_yP_{1-x-y}$ layer, or the like can be used as the second Schottky layer.

Furthermore, although the HEMT was described in the above examples, the present invention can be applied to a semiconductor device employing a Schottky junction such as an SBD, an MESFET and an MSM. Moreover, although the Schottky junction configured of a n-type semiconductor and metal was described, it is apparent that the present invention can also be applied to a Schottky junction configured of a p-type semiconductor and metal to obtain the similar effect.

As apparent from the above description, according to the present invention, the leakage current can be reduced by cooling the carrier passing through the Schottky junction.

In the Schottky layer of double layer structure, by using a semiconductor layer having electron affinity larger than that of the first Schottky layer as the second Schottky layer formed on the metal electrode side, inconvenience occurring during crystalline growth or in processes for device production can be avoided. The thermal stability can also be improved and the deterioration of the Schottky characteristics can be prevented.

In the Schottky layer of triple layer structure, by using the second Schottky layer (the middle layer) as the well layer, the leakage current can further be reduced. In the Schottky layer of double layer structure, by laminating a plurality of second Schottky layers or by varying the composite ratio of the semiconductor of the second Schottky layer, the leakage current can further be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A heterojunction semiconductor device, comprising:
   a first Schottky contact layer made of a first semiconductor;

a second Schottky contact layer made of a second semiconductor; and a metal electrode, wherein:

said first Schottky contact layer, said second Schottky contact layer and said metal electrode are laminated in this order on a semiconductor substrate or on a main structure of said semiconductor device;

said first Schottky contact layer serves as a barrier layer toward said second Schottky contact layer;

a layer thickness of said second Schottky contact layer is greater than the mean free path of carriers in said second Schottky contact layer, so that said second Schottky contact layer cools down hot electrons in said second Schottky contact layer even when a lattice temperature of said second Schottky contact layer is constant, and said first Schottky contact layer is lattice-matched to said semiconductor substrate or to said main structure of said semiconductor device.

2. The heterojunction semiconductor device of claim 1, wherein a barrier of $\Delta Ec$ is formed between the second layer and the first layer, and wherein the kinetic energy of part of the electrons reaching an interface between the second layer and the first layer is less than $\Delta Ec$.

3. The heterojunction semiconductor device of claim 1, wherein the second layer has an electron affinity higher than the first layer.

4. A heterojunction semiconductor device, comprising:

a first Schottky contact layer made of a first semiconductor; and a second Schottky contact layer made of a second semiconductor; and a metal electrode, wherein:

said first Schottky contact layer, said second Schottky contact layer and said metal electrode are laminated in this order on a semiconductor substrate or on a main structure of said semiconductor device;

said first Schottky contact layer serves as a barrier layer toward said second Schottky contact layer;

a layer thickness of said second Schottky contact layer is greater than the mean free path of carriers in said second Schottky contact layer, so that said second Schottky contact layer cools down hot electrons in said second Schottky contact layer even when a lattice temperature of said second Schottky contact layer is constant, and said first Schottky contact layer comprises non-doped $In_{0.52}Al_{0.48}As$ and has a film thickness of about 10 nm, said second Schottky contact layer comprises non-doped $In_{0.52}Al_xGa_{1-x}As$ and has a film thickness of about 20 nm, wherein x continuously increases from 0.24 to 0.48 starting with said first Schottky contact layer side toward said metal electrode side.

5. The heterojunction semiconductor device of claim 1, wherein the first layer comprises non-doped $In_{0.75}Al_{0.25}P$ and has a film thickness of about 10 nm, the second layer comprises non-doped $In_{0.52}Al_xGa_{1-x}As$ and has a film thickness of about 20 nm, and the composite ratio x continuously increases from x=0.24 to x=0.48.

6. The heterojunction semiconductor device of claim 1 in an SBD.

7. The heterojunction semiconductor device of claim 1 in an MESFET.

8. The heterojunction semiconductor device of claim 1 in an MSM.

9. The heterojunction semiconductor device of claim 1 in an HEMT.

10. A heterojunction semiconductor device, comprising:

a first Schottky contact layer made of a first semiconductor, a second Schottky contact layer made of a second semiconductor;

a third Schottky contact layer made of a third semiconductor; and a metal electrode, wherein:

said first Schottky contact layer, said second Schottky contact layer, said third Schottky contact layer and said metal electrode are laminated in this order on a semiconductor substrate or on a main structure of said semiconductor device;

said first Schottky contact layer and said third Schottky contact layer serve as a barrier layer toward said second Schottky contact layer;

a layer thickness of said second Schottky contact layer is greater than the mean free path of carriers in said second Schottky contact layer, so that said second Schottky contact layer cools down hot electrons in said second Schottky contact layer even when a lattice temperature of said second Schottky contact layer is constant; and said first Schottky contact layer is lattice-matched to said semiconductor substrate or to said main structure of said semiconductor device.

11. The heterojunction semiconductor device of claim 10, wherein the electron affinity of the second layer is larger than that of the first layer and the third layer.

12. The heterojunction semiconductor device of claim 10, wherein a barrier of $\Delta Ec$ is formed between the second layer and the first layer, and wherein the kinetic energy of part of the electrons reaching an interface between the second layer and the first layer is less than $\Delta Ec$.

13. The heterojunction semiconductor device of claim 10, wherein the composite ratio of the semiconductor in the second layer is varied such that a energy band gap of the second layer increases steadily from the first layer side toward the metal electrode.

14. The heterojunction semiconductor device of claim 10, wherein the first layer comprises non-doped $In_{0.52}Al_{0.48}As$ and has a film thickness of about 10 nm, the second layer comprises non-doped $In_{0.52}Al_{0.24}Ga_{0.24}As$ and has a film thickness of about 10 nm, and the third layer comprises non-doped $In_{0.52}Al_{0.48}As$ and has a film thickness of about 10 nm.

15. The heterojunction semiconductor device of claim 10, wherein the first layer comprises non-doped $In_{0.52}Al_{0.48}As$ and has a film thickness of about 10 nm, the second layer comprises non-doped $In_{0.52}Al_{0.24}Ga_{0.24}As$ and has a film thickness of about 10 nm, and the third layer comprises non-doped $In_{0.75}Al_{0.25}P$ and has a film thickness of about 10 nm.

16. The heterojunction semiconductor device of claim 10, wherein the first layer comprises non-doped $In_{0.52}Al_{0.48}As$ and has a film thickness of about 10 nm, the second layer comprises non-doped $In_{0.52}Al_{0.24}Ga_{0.24}As$ and has a film thickness of about 10 nm, and the third layer comprises non-doped $In_{0.75}Al_{0.25}P$ and has a film thickness of about 10 nm.

17. The heterojunction semiconductor device of claim 10, wherein the first and third layers comprise any of $In_xGa_yAl_{1-x-y}P$ or $In_xAl_{1-x}As$ or $Ga_xAl_{1-x}As_ySb_{1-y}$, and the second layer comprises any of $In_xGa_{1-x}As_yP_{1-y}$ or $GaAs_xSb_{1-x-y}$.

17

18. The heterojunction semiconductor device of claim 10 in an SBD.

19. The heterojunction semiconductor device of claim 10 in an MESFET.

20. The heterojunction semiconductor device of claim 10 in an MSM.

21. The heterojunction semiconductor device of claim 10 in an HEMT.

22. A heterojunction semiconductor device, comprising:
a first Schottky contact layer made of a first semiconductor;
a second Schottky contact layer made of a second semiconductor; and
a metal electrode, wherein:
said first Schottky contact layer, said second Schottky contact layer and said metal electrode are laminated in this order on a semiconductor substrate or on a main structure of said semiconductor device;
a composition of said second semiconductor forming said second Schottky contact layer varies in such a manner that a energy band gap of said second Schottky contact layer increases continuously or discretely starting with said first Schottky contact layer side toward said metal electrode side;
said first Schottky contact layer serves as a barrier layer toward at least a part of said second Schottky contact layer adjacent to said first Schottky contact layer; and
a layer thickness of said second Schottky contact layer is greater than the mean free path of carriers in said second Schottky contact layer, so that said second Schottky contact layer cools down hot electrons in said second Schottky contact layer even when a lattice temperature of said second Schottky contact layer is constant.

23. The heterojunction semiconductor device of claim 22, wherein a barrier of ΔEc is formed between the second layer and the first layer, and wherein the kinetic energy of part of the electrons reaching an interface between the second layer and the first layer is less than ΔEc.

24. The heterojunction semiconductor device of claim 22, wherein the second layer has an electron affinity higher than the first layer.

25. The heterojunction semiconductor device of claim 22, wherein the first layer comprises non-doped $In_{0.52}Al_{0.48}As$ and has a film thickness of about 10 nm, the second layer comprises non-doped $In_{0.52}Al_xGa_{1-x}As$ and has a film thickness of about 20 nm, and the composite ratio x continuously increases from x=0.24 to x=0.48.

26. The heterojunction semiconductor device of claim 22, wherein the first layer comprises non-doped $In_{0.75}Al_{0.25}P$ and has a film thickness of about 10 nm, the second layer comprises non-doped $In_{0.52}Al_xGa_{1-x}As$ and has a film thickness of about 20 nm, and the composite ratio x continuously increases from x=0.24 to x=0.48.

27. A heterojunction semiconductor device, comprising:
a Schottky contact layer comprising a plurality of first semiconductor layers made of a first semiconductor and a plurality of second semiconductor layers made of a second semiconductor, said plurality of first semiconductor layers and said plurality of second semiconductor layers being alternately laminated; and
a metal electrode, wherein:
said Schottky contact layer and said metal electrode are laminated in this order on a semiconductor substrate or on a main structure of said semiconductor device;

18 said first semiconductor layers serve as a barrier layer toward said second semiconductor layers;
a layer thickness of said second semiconductor layer is greater than the mean free path of carriers in said second semiconductor layer, so that said second semiconductor layer cools down hot electrons in said second semiconductor layer even when a lattice temperature of said second semiconductor layer is constant; and
said first semiconductor layer is lattice-matched to said semiconductor substrate or to said main structure of said semiconductor device.

28. The heterojunction semiconductor device of claim 1 or 4, wherein the main structure of the semiconductor device comprises a buffer layer, a channel layer, a spacer layer and an electron supply layer.

29. A heterojunction semiconductor device, comprising:
a first Schottky contact layer made of a first semiconductor;
a second Schottky contact layer made of a second semiconductor; and
a metal electrode, wherein:
said first Schottky contact layer, said second Schottky contact layer and said metal electrode are laminated in this order on a semiconductor substrate or on a main structure of said semiconductor device;
said first Schottky contact layer serves as a barrier layer toward said second Schottky contact layer;
said second Schottky contact layer has such a thickness that the second Schottky contact layer cools down hot electrons in said second Schottky contact layer even when a lattice temperature of said second Schottky contact layer is constant; and
said first Schottky contact layer is lattice-matched to said semiconductor substrate or to said main structure of said semiconductor device.

30. A heterojunction semiconductor device, comprising:
a first Schottky contact layer made of a first semiconductor;
a second Schottky contact layer made of a second semiconductor;
a third Schottky contact layer made of a third semiconductor; and
a metal electrode, wherein:
said first Schottky contact layer, said second Schottky contact layer, said third Schottky contact layer and said metal electrode are laminated in this order on a semiconductor substrate or on a main structure of said semiconductor device;
said first Schottky contact layer and said third Schottky contact layer serve as a barrier layer toward said second Schottky contact layer;
said second Schottky contact layer has such a thickness that said second Schottky contact layer cools down hot electrons in said second Schottky contact layer even when a lattice temperature of said second Schottky contact layer is constant; and
said first Schottky contact layer is lattice-matched to said semiconductor substrate or to said main structure of said semiconductor device.

31. A heterojunction semiconductor device, comprising:
a first Schottky contact layer made of a first semiconductor;
a second Schottky contact layer made of a second semiconductor; and
a metal electrode, wherein:

said first Schottky contact layer, said second Schottky contact layer and said metal electrode are laminated in this order on a semiconductor substrate or on a main structure of said semiconductor device;

a composition of said second semiconductor varies in such a manner that a energy band gap of said second Schottky contact layer increases continuously or discretely starting with said first Schottky contact layer side toward said metal electrode side;

said first Schottky contact layer serves as a barrier layer toward at least a part of said second Schottky contact layer adjacent to said first Schottky contact layer; and said second Schottky contact layer has such a thickness that the second Schottky contact layer cools down hot electrons in said second Schottky contact layer even when a lattice temperature of said second Schottky contact layer is constant.

32. A heterojunction semiconductor device, comprising:

a Schottky contact layer comprising a plurality of first semiconductor layers made of a first semiconductor and a plurality of second semiconductor layers made of a second semiconductor, said plurality of first semiconductor layers and said plurality of second semiconductor layers being alternately laminated; and a metal electrode, wherein:

said Schottky contact layer and said metal electrode are laminated in this order on a semiconductor substrate or on a main structure of said semiconductor device;

said first semiconductor layers serve as a barrier layer toward said second semiconductor layers;

said second semiconductor layer has such a thickness that said second semiconductor layer cools down hot electrons in said second semiconductor layer even when a lattice temperature of said second semiconductor layer is constant; and said first semiconductor layer is lattice-matched to said semiconductor substrate or to said main structure of said semiconductor device.

33. A heterojunction semiconductor device of claim 4, wherein said first Schottky contact layer is lattice-matched to said semiconductor substrate or to said main structure of said semiconductor device.

34. A heterojunction semiconductor device of claim 22, wherein said first Schottky contact layer is lattice-matched to said semiconductor substrate or to said main structure of said semiconductor device.

35. A heterojunction semiconductor device of claim 31, wherein said first Schottky contact layer is lattice-matched to said semiconductor substrate or to said main structure of said semiconductor device.

36. The heterojunction semiconductor device of claim 1, wherein said semiconductor substrate and said main structure of the semiconductor device are formed of InP.

37. The heterojunction semiconductor device of claim 10, wherein said semiconductor substrate and said main structure of said semiconductor device are formed of InP.

38. The heterojunction semiconductor device of claim 27, wherein said semiconductor substrate and said main structure of said semiconductor device are formed of InP.

39. The heterojunction semiconductor device of claim 29, wherein said semiconductor substrate and said main structure of said semiconductor device are formed of InP.

40. The heterojunction semiconductor device of claim 30, wherein said semiconductor substrate and said main structure of said semiconductor device are formed of InP.

41. The heterojunction semiconductor device of claim 32, wherein said semiconductor substrate and said main structure of said semiconductor device are formed of InP.

42. The heterojunction semiconductor device of claim 33, wherein said semiconductor substrate and said main structure of said semiconductor device are formed of InP.

43. The heterojunction semiconductor device of claim 34, wherein said semiconductor substrate and said main structure of said semiconductor device are formed of InP.

44. The heterojunction semiconductor device of claim 35, wherein said semiconductor substrate and said main structure of said semiconductor device are formed of InP.

* * * * *